United States Patent
Walther

(10) Patent No.: US 6,323,497 B1
(45) Date of Patent: Nov. 27, 2001

(54) METHOD AND APPARATUS FOR CONTROLLING ION IMPLANTATION DURING VACUUM FLUCTUATION

(75) Inventor: Steven R. Walther, Andover, MA (US)

(73) Assignee: Varian Semiconductor Equipment Assoc., Gloucester, MA (US)

( * ) Notice: Subject to any disclaimer, the term of this patent is extended or adjusted under 35 U.S.C. 154(b) by 0 days.

(21) Appl. No.: 09/586,492

(22) Filed: Jun. 2, 2000

(51) Int. Cl.7 .................................................... G21G 5/10
(52) U.S. Cl. .................................... 250/492.21; 250/492.1
(58) Field of Search .............................. 118/723; 438/14, 438/15; 116/208; 250/492.21; 364/550; 156/345

(56) References Cited

U.S. PATENT DOCUMENTS

| 4,283,631 | 8/1981 | Turner .............................. 250/492 B |
| 4,421,988 | 12/1983 | Robertson et al. ............... 250/492.2 |
| 4,449,051 | 5/1984 | Berkowitz ......................... 250/492.2 |
| 4,504,194 | 3/1985 | Holden .................................. 417/48 |
| 4,587,433 | 5/1986 | Farley .............................. 250/492.2 |
| 4,751,393 | 6/1988 | Corey, Jr. et al. ............. 250/492.21 |
| 4,807,994 | 2/1989 | Felch et al. ......................... 356/326 |
| 4,922,106 | 5/1990 | Berrian et al. .................... 250/492.2 |
| 5,475,618 * | 12/1995 | Le ........................................ 364/550 |
| 5,572,038 | 11/1996 | Sheng et al. .................... 250/492.21 |
| 5,711,843 * | 1/1998 | Jahns ..................................... 156/345 |
| 5,760,409 | 6/1998 | Chen et al. ..................... 250/492.21 |
| 6,101,971 * | 8/2000 | Denholm .............................. 118/723 |

* cited by examiner

Primary Examiner—John F. Niebling
Assistant Examiner—André C Stevenson
(74) Attorney, Agent, or Firm—Wolf, Greenfield & Sacks

(57) ABSTRACT

A method and apparatus for controlling implantation during vacuum fluctuations along a beam line. Vacuum fluctuations may be detected based on a detected beam current and/or may be compensated for without measuring pressure in an implantation chamber. A reference level for an ion beam current can determined and a difference between the reference value and the measured ion beam current can be used to control parameters of the ion implantation process, such as a wafer scan rate. The difference value can also be scaled to account for two types of charge exchanging collisions that result in a decrease in detected beam current. A first type of collision, a non-line of sight collision, causes a decrease in detected beam current, and also a decrease in the total dose delivered to a semiconductor wafer. A second type of collision, a line of sight collision, causes a decrease in detected beam current, but does not affect a total dose delivered to the wafer. Scaling of the difference can therefore be used to adjust a wafer scan rate that accounts for non-line of sight collisions.

15 Claims, 4 Drawing Sheets

METHOD AND APPARATUS FOR CONTROLLING ION IMPLANTATION DURING VACUUM FLUCTUATION

FIELD OF THE INVENTION

The invention relates to controlling ion implantation during vacuum fluctuation. In particular, the invention relates to controlling an ion beam implantation process to compensate for vacuum fluctuation based on a measured beam current and not a measured pressure.

BACKGROUND OF THE INVENTION

Ion implantation is a standard technique for introducing conductivity-altering impurities into semiconductor wafers. A typical ion implantation process uses an energetic ion beam to introduce impurities into the semiconductor wafers. As is well-known, introducing the impurities at a uniform depth and density into the wafers is important to ensure that the semiconductor devices being formed operate within specification.

One factor in the ion implantation process that can affect the uniformity of the impurity dose in the wafer is vacuum fluctuations during the implantation process. The vacuum fluctuations can be caused by photoresist or other materials coated on a semiconductor wafer that outgas, volatilize or sputter when the ion beam impacts the semiconductor wafer. The outgassing, volatilization or sputtering releases gas particles, which cause a pressure rise in the normally high vacuum condition along the beam line and can result in collisions between ions in the beam and released particles. These collisions can cause ions in the beam to experience a charge change. For example, singly-charged positive ions in an ion beam may collide with residual gas atoms produced by photoresist outgassing during implantation, and experience a charge exchange without a significant change in kinetic energy. The singly-charged positive ions may be neutralized by the collisions and impact the semiconductor wafer in the neutral charge state. In contrast, when outgassing, volatilization or sputtering does not occur from the semiconductor wafer surface, the vacuum level can remain relatively high and constant along the beam line, thus resulting in fewer ion charge exchanging collisions.

The charge exchanging collisions that result when the vacuum level along the beam line drops can cause problems because the detectors used to determine and control the ion beam current (and also the total dose of the wafer) during implantation typically only detect charged particles, but not neutral particles. The neutral particles that are implanted in the wafer are the desired implantation species and have the desired energies for implantation and thus, should be counted in the total implant dose. Since the typical ion beam current detector, such as a Faraday cup, is not capable of detecting the neutral particles, neutral particles that should be counted as contributing to the wafer dose are not detected. As a result, a beam current that is less than the actual beam current is detected, thereby prompting an increase in the beam current and overdosing of the wafer.

Previous methods for controlling implantation uniformity during vacuum fluctuations include detecting both the ion beam current and the vacuum level in the implantation chamber and controlling the ion beam accordingly, as disclosed in U.S. Pat. No. 4,587,433 to Farley and U.S. Pat. No. 5,760,409 to Chen. Such systems have drawbacks, including improper control caused by a delay between an actual change in vacuum along the beam line and the time when the vacuum change, i.e., a pressure change, is detected. This delay between actual vacuum change and detection can cause a delay in ion beam control and result in improper wafer dosing. This type of method also has the disadvantage of requiring the empirical correlation of a plurality of detected gas pressure and beam current values with a corresponding correction value for a plurality of sets of ion implantation parameters, such as gas composition, beam energy, implant species, amount of dose, photoresist type, etc.

Accordingly, a method for controlling implantation during vacuum fluctuation that is independent of such implantation parameters and that can rapidly respond to vacuum fluctuation is needed.

SUMMARY OF THE INVENTION

The invention provides methods and apparatus for controlling an ion beam implantation process in the presence of vacuum fluctuation along the beam line. In one aspect of the invention, vacuum fluctuations can be detected based on a detected ion beam current, and not a detected pressure. Thus, an ion implantation apparatus and method may correct for vacuum fluctuations based on beam current without detecting pressure within an implantation chamber.

In one illustrative embodiment, a method for controlling an ion implantation process includes generating an ion beam, and directing the ion beam along a beamline. A beam current is detected along the beamline, and a material is implanted with ions in the ion beam. Vacuum fluctuations during implantation are compensated for based on detected beam current and not based on a detected pressure.

In one illustrative embodiment, an ion beam including energetic particles for implantation into a semiconductor wafer is generated. A reference value for the ion beam current is then determined. The reference value for the ion beam current can be determined by actually measuring the ion beam current while a vacuum level along the beam line is at a desired level, e.g., is at a relatively high and stable level before implantation of the semiconductor wafer begins. The reference value for the ion beam current can also be a stored value that is retrieved from memory or input by a human operator, for example. Once the reference value for the ion beam current is determined, implantation of the semiconductor wafer is performed. The ion beam current is measured during implantation, and a difference between the reference value for the ion beam current and the measured ion beam current is determined. The ion beam current, a wafer scan rate or other implantation process parameters can be adjusted based on the difference between the reference value and the measured ion beam current. Since the measured ion beam current includes information regarding vacuum fluctuation, e.g., a decrease in measured beam current may be assumed to be caused mainly by vacuum fluctuation, the ion implantation process can be adjusted accordingly, e.g., a wafer scan rate may be decreased in response to a decrease in detected beam current.

In another illustrative embodiment of the invention, a difference between the reference value and the measured beam current can be scaled and the scaled difference value used to control ion implantation process parameters. For example, the ion implantation system can include an angle corrector magnet that bends and collimates the ion beam before the beam is incident on a semiconductor wafer. In this type of arrangement, vacuum fluctuations along the beam line can cause an increase in ion charge exchanging collisions that occur in two regions along the beam line, i.e., a line-of-sight region and a non-line-of-sight region. Charge exchanging collisions in the non-line-of-sight region that neutralize a particle cause the particle to not be deflected by the angle corrector magnet along the path to the wafer. Instead, the neutral particles follow a path that does not impact the wafer. Thus, although the non-line-of-sight collisions cause a decrease in detected ion beam current at the wafer, the collisions also cause a decrease in the dose rate at the wafer. In contrast, charge exchanging collisions that occur in the line-of-sight region neutralize energetic particles, but since the particles are traveling along a path toward the wafer, the neutral particles still are implanted in the wafer and contribute to the total dose. However, since the particles are neutralized, they are not detected as part of the total ion beam current. Thus, collisions that neutralize particles in the line-of-sight region cause a decrease in detected ion beam current, but not necessarily a change in the wafer dose rate. Scaling of the difference value between the reference value for the ion beam current and the measured ion beam current may be used to adjust the implantation process parameters (e.g., the wafer scan rate) to compensate for both line-of-sight and non-line-of-sight collisions.

For example, a detected decrease in ion beam current may be assumed to be largely due to vacuum fluctuations along the beam line. A portion of the detected decrease in ion beam current results from non-line-of-sight collisions, while the remaining portion of the detected decrease in ion beam current results from line-of-sight collisions. Since the line-of-sight collisions contribute to the decrease in ion beam current, but do not necessarily affect the total dose delivered to the wafer, this portion of the detected decrease in ion beam current need not necessarily be compensated for. Thus, the difference value between the reference level for the ion beam current and the detected ion beam current may be scaled to compensate mainly for non-line-of-sight collisions and to adjust the wafer dose rate to an appropriate level.

These and other aspects of the invention will be apparent and/or obvious from the following description.

BRIEF DESCRIPTION OF THE DRAWINGS

The invention is described below in connection with the following drawings, in which like reference numerals refer to like elements, and wherein:.

DETAILED DESCRIPTION

The invention is described below in connection with an ion implantation system. However, the invention can be used with other systems or processes that use beams of energetic, charged particles, such as electron beam imaging systems. Thus, the invention is not limited to the specific embodiments described below.

Figure 1:
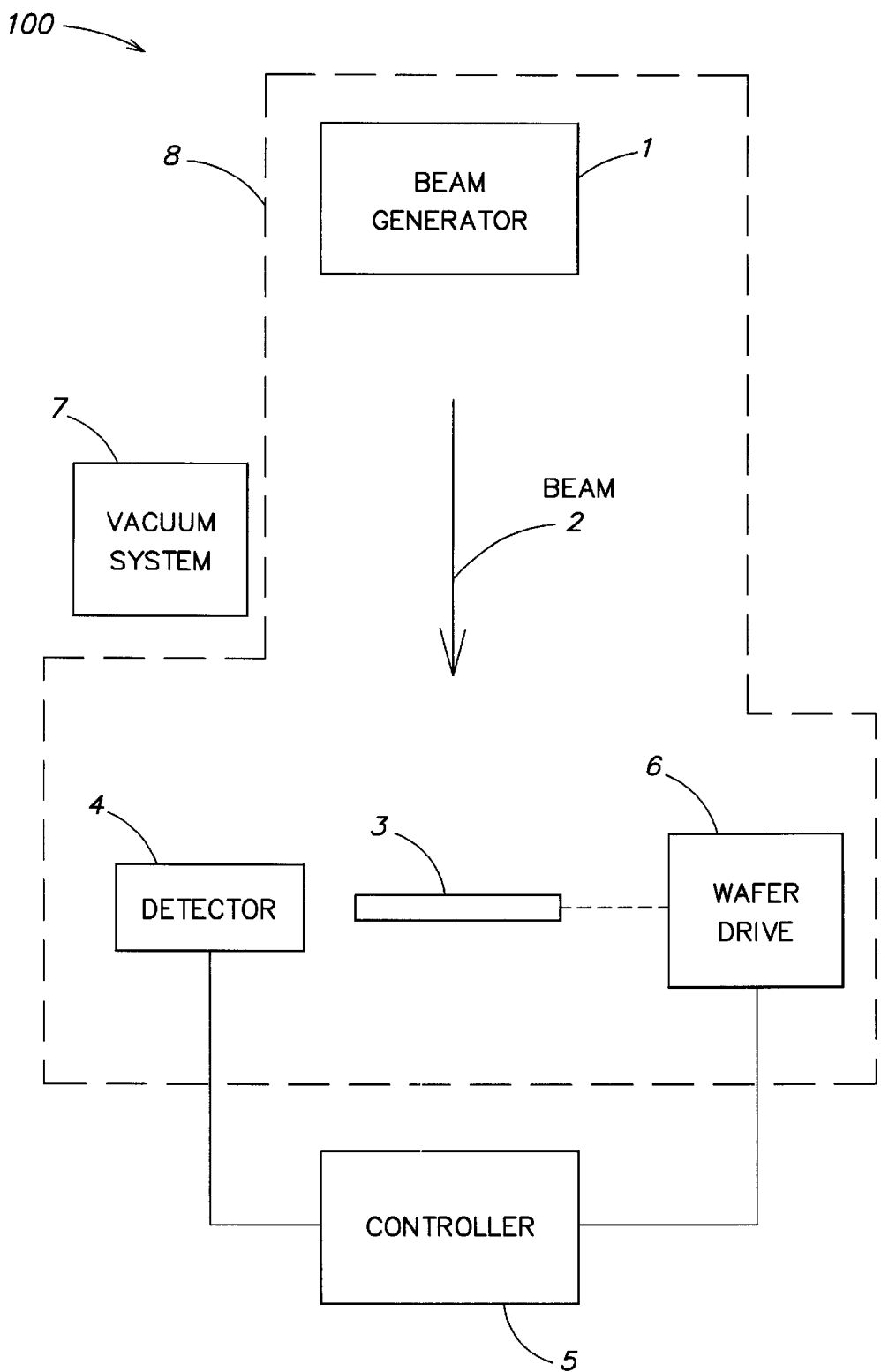
FIG. 1 is a schematic block diagram of a first ion implantation system in accordance with the invention.

FIG. 1 is a schematic block diagram of an ion implantation system 100 in accordance with the invention. The ion implantation system 100 includes a beam generator 1 that generates and directs a beam 2 toward a semiconductor wafer 3. The beam generator 1 can include various different types of components and systems to generate a beam 2 having desired characteristics. The beam 2 can be any type of charged particle beam, such as an energetic ion beam used to implant the semiconductor wafer 3. The semiconductor wafer 3 can take various physical shapes, such as the common disk shape. The semiconductor wafer 3 can include any type of semiconductor material or any other material that is to be implanted using the beam 2.

A beam current, i.e., an amount of charge carried by particles in the beam 2 to the wafer 3, is measured by a detector 4. The detector 4 can be any type of device that detects a level of the beam 2 current. For example, the detector 4 can be a Faraday cup or other device, as are well known in the art. The detector 4 can be fixed in place or movable and can be positioned in a variety of different ways, such as along the beam 2 path to the wafer 3, adjacent the wafer 3 as shown in FIG. 1, behind the wafer 3, etc. Other types of devices to measure the beam 2 current, such as devices that use calorimetery or beam-induced magnetic field measurement can be used, if desired, as the detector 4.

The detector 4 outputs a signal representing the detected beam 2 current to a controller 5. The controller 5 can be or include a general purpose computer or network of general purpose computers that are programmed to perform desired input/output and other functions. The controller 5 can also include other electronic circuitry or components, such as application specific integrated circuits (e.g., ASICs), other hardwired or programmable electronic devices, discrete element circuits, FPGAs, etc. The controller 5 can also include devices, such as user input/output devices (keyboards, touch screens, user pointing devices, displays, printers, etc.), communication devices, data storage devices, mechanical drive systems, etc., to perform desired functions.

The controller 5 also communicates with a wafer drive 6 that is capable of moving the wafer 3 relative to the beam 2, e.g., the wafer drive 6 can scan the wafer 3 across the beam 2 to implant the wafer 3. The wafer drive 6 can include various different devices or systems to physically move the wafer 3 in a desired way. For example, the wafer drive 6 can include servo drive motors, solenoids, screw drive mechanisms, one or more air bearings, position encoding devices, mechanical linkages, robotic arms or any other components to move the wafer 3 as are well-known in the art.

The beam 2 is transported from the beam generator 1 to the wafer 3 in a relatively high vacuum environment created in a housing 8 by a vacuum system 7. By high vacuum, it is meant that low pressure exists in the housing 8. Conversely, low vacuum refers to a relatively higher pressure in the housing 8. The vacuum in the housing 8 is maintained using well-known systems, such as vacuum pumps, vacuum isolation valves, pressure sensors, etc. The vacuum system 7 may communicate with the controller 5, e.g., to provide information to the controller 5 regarding the current vacuum level in one or more portions of the housing 8.

The beam 2 is shown in FIG. 1 to follow a straight path from the beam generator 1 to the wafer 3. However, the beam 2 may follow a curved path with one or more deflections within the generator 1 and/or between the beam generator 1 and the wafer 3. The beam 2 can be deflected, for example, by one or more magnets, lenses or other ion optical devices.

Prior to implantation, the wafer drive 6 can move the wafer 3 away from the beam 2 so that the beam 2 is not incident on the wafer 3. The beam generator 1 then generates a beam 2 and the detector 4 detects a reference level for the beam current while a vacuum level within the housing 8 is at a desired level and/or is stable. As one example, the vacuum level at which the reference level for the beam current is determined may be a highest vacuum level generated by the vacuum system 7 within the housing 8. Of course, the reference level for the beam current may be determined for other vacuum-levels within the housing 8.

The detector 4 outputs a signal to the controller 5 that can be used by the controller 5 as the reference level for the beam current, or the controller 5 can process the signal to generate a reference level for the beam current. For example, the detector 4 may output an analog signal that represents a number of detected ions, and the controller 5 may convert the analog signal to a digital number that is stored within the controller 5. The stored digital number may be used as a reference level for the beam current.

During implantation, the beam 2 is incident on at least a portion of the wafer 3. The beam 2 can be scanned across the wafer 3 and/or the wafer 3 can be scanned across the beam 2 by the wafer drive 6. For example, the beam 2 may be scanned by the beam generator 1 in a plane parallel to the paper in FIG. 1, while the wafer 3 is moved in a direction perpendicular to the paper by the wafer drive 6.

Materials in or on the wafer 3, such as photoresist on the surface of the wafer 3, may outgas or otherwise produce materials when impacted by particles in the beam 2. This causes a vacuum fluctuation within the housing 8 that can cause the vacuum level to decrease near the wafer 3 and along the beamline. This decrease in vacuum level can cause an increase in the number of charge exchanging collisions that occur for particles in the beam 2 traveling to the wafer 3. As discussed above, the charge exchanging collisions, i.e., collisions between energetic particles in the beam 2 and materials released by outgassing or volatilization at the wafer 3, cause the charge of individual particles in the beam 2 to be changed. For example, singly positively charged ions in the beam 2 can be neutralized by collisions along the beamline, or the positively charged ions may be doubly positively charged. Although the charge of the ions can be altered, the energy of the particles is not substantially changed. Therefore, although the charge of some particles may be altered so that the detector 4 does not detect the presence of the particles, the particles may impact the wafer 3 and contribute to the overall impurity dosing of the wafer 3. Thus, the detector 4 may output a signal during implantation that indicates a decrease in beam current even though the total dosing of the wafer 3 is not affected.

The controller 5 can recognize, i.e., operate based on an assumption, that the detected decrease in beam current, or a portion of a detected decrease in beam current, has been caused by vacuum fluctuations during implantation, but that the total dose implanted in the wafer 3 is not being affected. Thus, the controller 5 can detect a vacuum fluctuation based on a detected decrease in beam current. It should be understood that the beam current may vary during implantation due to other factors, such as ion source variations, and that the controller 5 may determine that some portion of a detected beam current decrease has been caused by vacuum fluctuations, while another portion of the decrease has been caused by other factors, e.g., variations at the ion source. The controller 5 may adjust certain implantation parameters to correct for variations in beam current that are not due to vacuum fluctuations, as is known in the art and not described here. In addition, outgassing may vary with time, and the controller 5 may determine that the contribution of vacuum fluctuation to detected beam current decrease as compared to other factors may vary over time during implantation. In such cases the controller 5 may use an adjusted measured beam current that reflects only the contribution of vacuum fluctuation, and not the contribution of other factors, for purposes of controlling implantation.

The controller 5 may sense a decrease in beam current, but not necessarily adjust specific implantation parameters, such as a beam 2 scan rate, wafer 3 scan rate, etc. Instead, the controller 5 may output a signal to the vacuum system 7 indicating that a rise in vacuum pressure has been detected and that the vacuum level within the housing 8 should be adjusted accordingly. This signal to the vacuum system 7 may be provided in addition to measured vacuum level signals provided by pressure sensors to the vacuum system 7. Thus, based on the signal from the controller 5, the vacuum system 7 may begin adjusting the vacuum level within the housing 8 before a decrease in vacuum level is detected by pressure sensors associated with the vacuum system 7.

Alternately, the controller 5 may compare a detected beam current level provided by the detector 4 during implantation with the stored reference level for the beam current and use the difference between the two values to control either the beam 2 or the wafer drive 6. For example, the controller 5 may determine (based on stored information) that the decrease in beam current detected by the detector 4 during implantation is largely due to vacuum fluctuations along the beam line. Further, the controller 5 can determine that a portion of the detected decrease in beam current due to charge exchanging collisions does not affect the total dose delivered to the wafer 3, while another portion of the detected decrease in beam current does contribute to a decrease in the total dose delivered to the wafer 3. For example, some charge exchanging collisions may neutralize beam particles without affecting the particles' kinetic energy. The neutralized particles will not be detected by the detector 4, but still contribute to the total dose implanted in the wafer 3. Other collisions caused by the vacuum fluctuation may cause the charge and kinetic energy of a particle to be altered, or cause the particle to follow a trajectory that prevents the particle from being implanted in the wafer 3. These latter collisions cause a decrease in detected beam current, and also a decrease in the total dose implanted in the wafer 3. The controller 5 can scale the difference value between the detected beam current and the reference value for the beam current, so that a total dose delivered to the wafer 3 is adjusted to a desired level. The difference value can also be normalized, e.g., by dividing the difference value by the reference value. For example, the controller 5 may control the wafer drive 6 to move the wafer 3 more slowly across the beam 2 path based on the scaled and normalized scaled reference value. The scaling factors used by the controller 5 can be determined empirically and stored in the controller 5. Thus, when a particular difference value is determined by the controller 5, a corresponding scaling factor can be retrieved and used to adjust the difference value to appropriately control the beam 2 or movement of the wafer 3.

The controller 5 may also control for implantation non-uniformity in two dimensions caused by vacuum fluctuation. For example, vacuum fluctuation may cause implantation non-uniformity in two dimensions at the wafer 3, e.g., non-uniformity along the beam scan direction parallel to the paper in FIG. 1 and non-uniformity along the wafer scan direction perpendicular to the paper in FIG. 1. Thus, the controller 5 may control the beam scan rate and the wafer scan rate to control for non-uniformity in both directions. Different scale factors may also be used to control the beam scan rate and the wafer scan rate, respectively.

Figure 2:
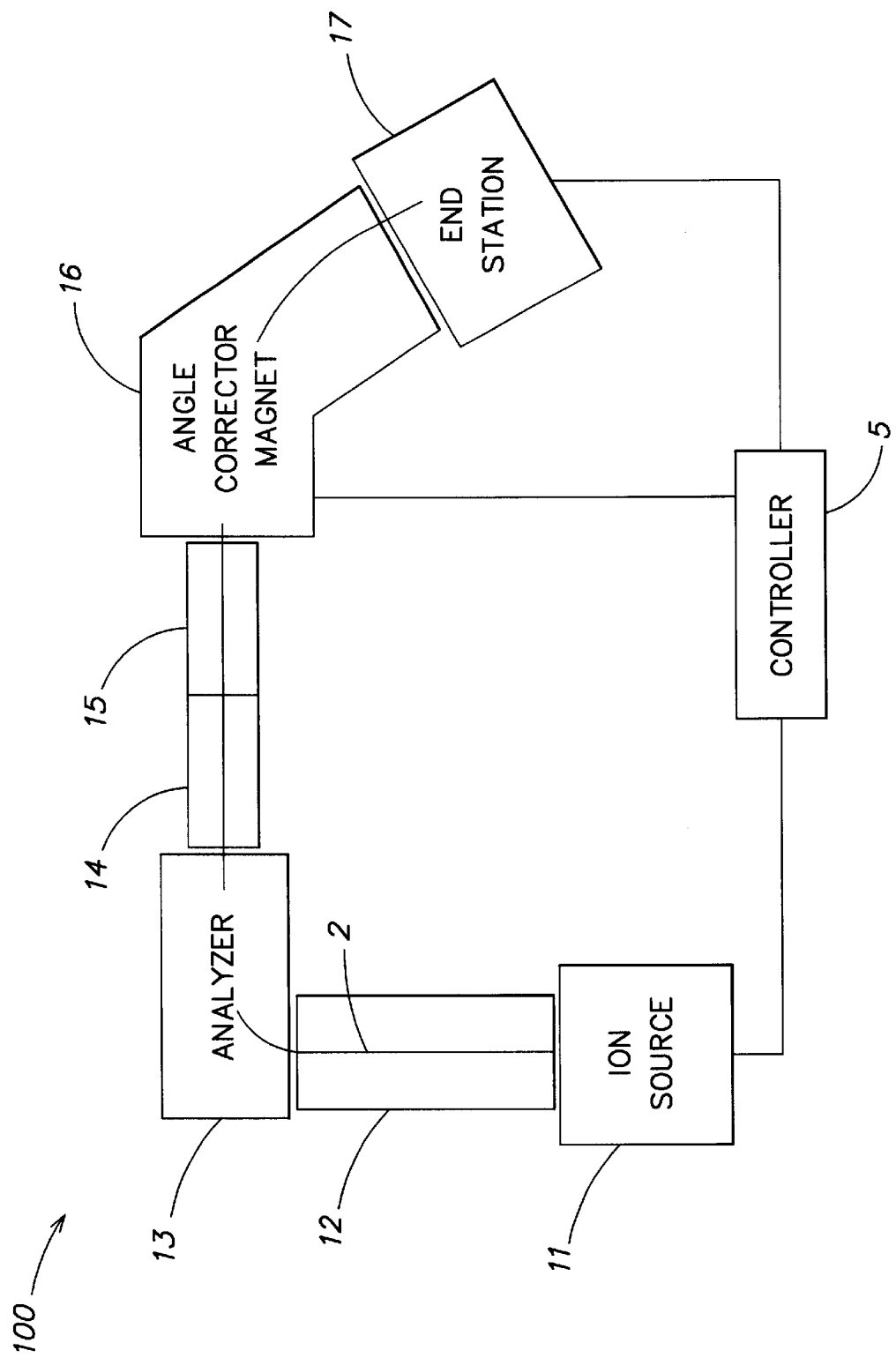
FIG. 2 is a schematic block diagram of a second ion implantation system in accordance with the invention.

FIG. 2 shows a more detailed schematic block diagram of an ion implantation system 100 in accordance with the invention. An ion source 11 generates ions and supplies an ion beam 2. As is known in the art, the ion source 11 may include an ion chamber and a gas box containing a gas to be ionized. The gas is supplied to the ion chamber where it is ionized. The ions thus formed are extracted from the ion chamber to form the ion beam 2. The ion beam 2 may have an elongated cross section and may be ribbon-shaped, with a long dimension of the beam 6 cross section preferably having a horizontal orientation, or the beam 2 may have a circular cross-section. An extraction power supply and extraction electrode 12 accelerate ions from the ion source 11. The extraction power supply may be adjustable, for example, from about 0.2 to 80 keV. Thus, ions from the ion source 11 may be accelerated to energies of about 0.2 to 80 keV by the extraction electrode 12. The construction and operation of ion sources are well-known to those skilled in the art.

The ion beam 2 passes through a suppression electrode and a ground electrode (not shown) to a mass analyzer 13. The mass analyzer 13 includes a resolving magnet that deflects ions in the ion beam 2 such that ions of a desired ion species pass through a resolving aperture 14 and undesired ion species do not pass through the resolving aperture 14. In a preferred embodiment, the mass analyzer 13 resolving magnet deflects ions of the desired species by 90°.

Ions of the desired ion species pass through the resolving aperture 14 to a scanner 15 (which is not required for systems using a ribbon-beam) positioned downstream of the mass analyzer 13. The scanner 15 may include scanning electrodes as well as other electrodes (not shown) for controlling the beam 2. Ions in the ion beam 2 are scanned and then pass through an angle corrector magnet 16. The angle corrector magnet 16 deflects ions of the desired ion species and converts the ion beam 2 from a diverging ion beam to a nearly collimated ion beam 2 having substantially-parallel ion trajectories. In a preferred embodiment, the angle corrector magnet 16 deflects ions of the desired ion species by 70°.

An end station 17 supports one or more semiconductor wafers in the path of the ion beam 2 such that ions of the desired species are implanted into the semiconductor wafers (not shown). The end station 17 may include a cooled electrostatic platen and a wafer drive 6 for moving wafers perpendicular to the long dimension of the ion beam 2 cross section, so as to distribute ions over the wafer surface.

The ion implantation system 100 may include additional components known to those skilled in the art. For example, the end station 17 typically includes automated wafer handling equipment for introducing wafers 3 into the ion implantation system 100 and for removing wafers after implantation. The end station 17 may also include a dose measuring system, an electron flood gun and other known components. It will be understood that the entire path traversed by the ion beam 2 is evacuated during ion implantation. Additional details of the ion implantation system 100 are not provided here since they are well-known in the art and are not necessarily important to the invention.

The components of the ion implantation system 100 are controlled by a controller 5. Thus, the controller 5 can monitor the ion implantation process and take steps to adjust various aspects of the process, such as the rate at which ions are produced from the ion source 11, the scan rate of the ion beam 2, the scan rate of the wafer relative to the ion beam 2 at the end station 17, etc.

Figure 3:
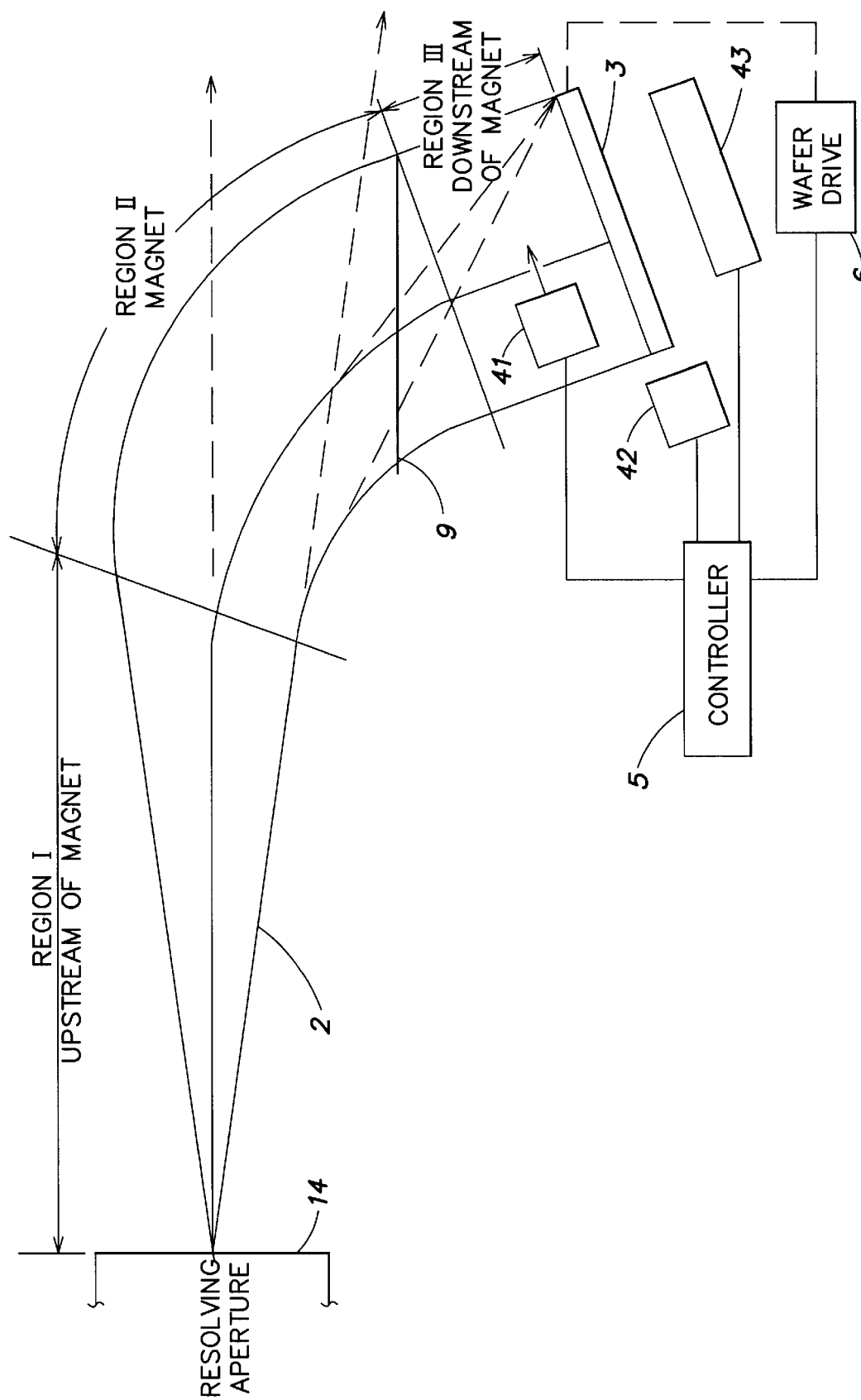
FIG. 3 is a schematic block diagram of a portion of the ion implantation system of FIG. 2.

FIG. 3 is a schematic diagram of a portion of the ion implantation system 100 in FIG. 2 from the resolving aperture 14 to the end station 17, and shows the beam 2 path from the resolving aperture 14 to the semiconductor wafer 3 in the end station 17. The ion beam 2 path is conceptually divided into three regions, where Region I is upstream of the angle corrector magnet 16, Region II is within the angle corrector magnet 16, and Region III is downstream of the angle corrector magnet 16. In Region I, the beam 2 is a diverging beam. In Region II, the angle corrector magnet 16 deflects the charged articles in the beam 2 by approximately 70° and collimates the beam. Thus, the beam 2 in Region III is a substantially collimated beam such that ions in the beam are all incident on the wafer 3 surface at substantially the same angle.

Before implantation of the wafer 3 begins, the controller 5 controls the wafer drive 6 to move the wafer 3 out of the path of the beam 2. The beam current of the ion beam 2 is then measured by one or more of the detectors 41, 42 and 43. The detector 41 is a profiler or traveling Faraday cup that is moved transverse to the beam 2 near the plane where the beam 2 is incident on the wafer 3. Use of this type of traveling Faraday detector 41 is well-known, and a signal produced by the detector 41 is used to determine uniformity of the beam 2. The beam current can also be measured by a Faraday detector 42 that is positioned adjacent the wafer 3 during implantation. Since the detector 42 is positioned adjacent the wafer 3, the detector 42 can detect the beam current either before the wafer 3 is positioned for implantation or during implantation of the wafer 3. A third detector 43 can also be used to detect beam current. Since the detector 43 is positioned downstream of the wafer 3 during implantation, the detector 43, which is typically a Faraday-type detector, is typically used before implantation to measure a total dose expected to be implanted in the wafer 3. It should be understood that although the detectors 41–43 in this example are Faraday-type detectors, other types of detectors for sensing the beam current, such as those using calorimetry or beam induced magnetic field measurement, may be used in addition to, or in place of, the detectors 41–43. In addition, it is not necessary to use all three detectors 41–43. For example, the detectors 41 and 43 may be eliminated or not used to detect the beam current to control the implantation process with respect to vacuum fluctuation. Thus, only the detector 42 may be used to detect beam current.

In the following example, only the detector 42 is used to detect the ion beam current and control the implantation process during vacuum fluctuation. When a vacuum level within the end station 17 and along the beam line is at a desired reference level, e.g., when the wafer 3 is positioned away from the beam 2 path and the vacuum along the beam line is at a relatively high and uniform level, the detector 42 detects the beam current of the ion beam 2. This detected current measured when the vacuum level is at a reference level is used by the controller 5 as a reference value for the ion beam current. The reference value for the ion beam current is not necessarily determined when the wafer 3 is out of the beam 2 path. That is, the reference value for the ion beam current may be a detected beam current when the wafer 3 is in a position to be implanted, and the vacuum along the beamline is at a desired level, e.g., at the beginning of implantation of the wafer 3. Alternately, the controller 5 may use an empirically determined reference value for the beam current that is stored within the memory of the controller 5.

After implantation of the wafer 3 begins, substances in or on the wafer 3, such as photoresist, may be begin to outgas or otherwise release particles. This particle release causes a fluctuation in the vacuum level near the wafer 3 and along the beam line, e.g., along the beam path back to the resolving aperture 14. As discussed above, a decrease in the vacuum level along the beamline can cause an increase in the number of charge exchanging collisions between ions in the beam 2 and other particles, such as those released from the wafer 3. These charge exchanging collisions can cause ions in the beam 2 to become neutralized. Neutral particles are not acted on by the angle corrector magnet 16, and thus the neutral particles follow a straight line path from the point at which the particle was neutralized. Charge exchanging collisions can occur anywhere along the beamline, and the location of the charge exchanging collision typically determines whether the neutralized particle impacts the wafer 3 and contributes to the overall dose implanted in the wafer 3. In this example, charge exchanging collisions that neutralize ions in the beam 2 and that occur upstream of a line 9 cause the neutralized particles to not impact the wafer 3 or to be measured as contributing to the beam current. However, charge exchanging collisions that neutralize ions in the beam 2 and that occur downstream of the line 9 result in the neutralized particles impacting the wafer 3. The path of neutralized particles in FIG. 3 is shown by dashed line trajectories. Since the detector 42 cannot detect neutralized particles, the detector 42 detects a decrease in beam current, even though some of the neutralized particles that undergo charge exchanging collisions downstream of the line 9 contribute to the overall dose of the wafer 3. Charge exchanging collisions that occur upstream of the line 9 are termed non-line of sight collisions, while collisions that occur downstream of the line 9 are termed line of sight collisions, since the neutralized particles have a line of sight to the wafer and contribute to the dose of the wafer 3.

Neutralizing of particles in the beam 2 when the vacuum level drops along the beamline causes the detector 42 to detect a decrease in the beam current. A difference $\Delta I$ between the reference value for the beam current $I_{ref}$ and the measured beam current $I_m$, is contributed to by both non-line of sight collisions and line of sight collisions that neutralize particles in the beam 2. Thus, the beam current difference $\Delta I$ is a function of both the line of sight collisions and non-line of sight collisions.

Since the line of sight collisions contribute to the overall dose of the wafer 3, the controller 5 cannot simply either increase the beam current of the beam 2 so that the measured current $I_m$ is equal to the reference value $I_{ref}$ or adjust the scan rate of the wafer 3 to compensate for the beam current difference $\Delta I$, without taking into account the neutralized particles that are implanted in the wafer 3, but do not contribute to the detected beam current. Accordingly, the difference value $\Delta I$ is scaled using an appropriate scale factor, and the scaled value is used to control the wafer scan rate, beam current, or other implantation parameters to achieve a desired dose of the wafer 3. Preferably, the scan rate of the wafer 3 is adjusted. Scale factors may generally represent an estimation of the percentage amount of a detected decrease in measured beam current $I_m$ that is caused by non-line of sight collisions. Scale factors can be determined empirically, e.g., an appropriate scale factor may be determined based on a measured beam current $I_m$ and the actual dose implanted in the wafer 3 during an actual implantation process.

Scale factors may also be determined by mathematically modeling an implantation process. For example, scale factors may be based on calculated distance*density products that are obtained from implantation system models. Neutral particle densities, e.g., from outgassing products and other sources, may be calculated based on a model of the vacuum system, and the beam path length*neutral particle density may be determined for line-of-sight and non-line-of-sight paths. Based on the relative values of these distance*density products, the scale factors for the implantation system may be derived. An empirical approach may be more accurate than a modeling approach for determining scale factors, but using an empirical approach may be more time consuming.

As one example of how a scale factor may be used, if a 50% decrease in beam current is detected, e.g., a difference value $\Delta I$ is normalized by dividing $\Delta I$ by the reference value $I_{ref}$ giving $\Delta I/I_{ref}=0.5$, and half of the detected decrease in beam current is caused by non-line of sight collisions and the other half of the detected decrease in beam current is caused by line of sight collisions, the wafer scan rate may be decreased by ¼ of its original value (adjusted by a scale factor of 0.25) to achieve a desired dose rate for the wafer 3. That is, although the detected beam current $I_m$ is half the reference value for the beam current $I_{ref}$, only ½ of the decrease in detected beam current need be compensated for since ½ of the detected decrease in beam current is caused by neutralized particles that still contribute to the overall dose of the wafer 3. Thus, a 25% increase in detected beam current $I_m$ or a 25% decrease in the wafer scan rate may be used to compensate for the non-line of sight collisions causing an overall decrease in the dosing of the wafer 3.

The above example is an overly simplified example used to describe one aspect of the invention. It should be understood that other differences in detected beam current and a reference value for the beam current may be determined, and that other ratios of charge exchanging collisions that do and do not contribute to the overall wafer 3 dose may be encountered. In addition, non-uniformity effects in two dimensions may be compensated for by the controller 5. For example, empirically-derived scale factors may be used to adjust both a beam scan rate and a wafer scan rate to adjust for non-uniform dosing in both the beam scan and wafer scan directions that is caused by vacuum fluctuations. Of course, the scale factors may be derived mathematically, e.g., by modeling beam paths and neutral particle densities in the corrector magnet 16 to estimate the beam scan direction and wafer scan direction non-uniformity and scan rates to adjust for the non-uniformity in two directions.

The controller 5 can use the determined beam current difference $\Delta I$ for other purposes, such as controlling the vacuum system in the ion implantation system 100 to compensate for the vacuum fluctuations during implantation. The controller 5 may also use the beam current difference information to control other parameters of the implantation process, such as to control scanning of the beam 2, e.g., by adjusting a scanning waveform applied to scan plates in the scanner 15, etc. Control of scanning of the beam 2 may be used to adjust for horizontal non-uniformity, i.e., implantation non-uniformity in the wafer 3 in a direction perpendicular to the wafer scan direction.

The controller 5 can also use the determined beam current difference information to make adjustments for beam non-uniformity effects of the vacuum fluctuations along the beam line. As can be seen in FIG. 3, ions on the outside of the beam envelope travel a longer distance from the resolving aperture 14 before reaching the line 9 than ions traveling on the inside of the beam envelope. Thus, ions traveling on the outside of the beam envelope may have a higher probability of experiencing a charge exchanging collision before reaching the line 9. This alone may result in underdosing one side of the wafer 3 (e.g., the right side of the wafer 3 in FIG. 3) compared to the other side.

However, ions traveling along the inside of the beam envelope travel some distance from the line 9 before reaching Region III. If an ion experiences a charge exchanging collision between the line 9 and Region III, the neutralized particle is no longer steered by the angle corrector magnet 16 and follows a straight line path toward a portion of the wafer 3 further to the right than the ion would have originally impacted. This tends to cause extra dosing of the right side of the wafer 3, and may nearly counteract charge exchanging collisions that more frequently occur along outer paths of the beam 2. The inventor has found that the effects of vacuum fluctuations on beam uniformity in the arrangement shown in FIG. 3 typically have a relatively small effect on implant uniformity. However, in other configurations, vacuum fluctuations may have a greater effect on implant uniformity. In those cases, the controller 5 may adjust the beam parameters to counteract the effects of vacuum fluctuation.

Figure 4:
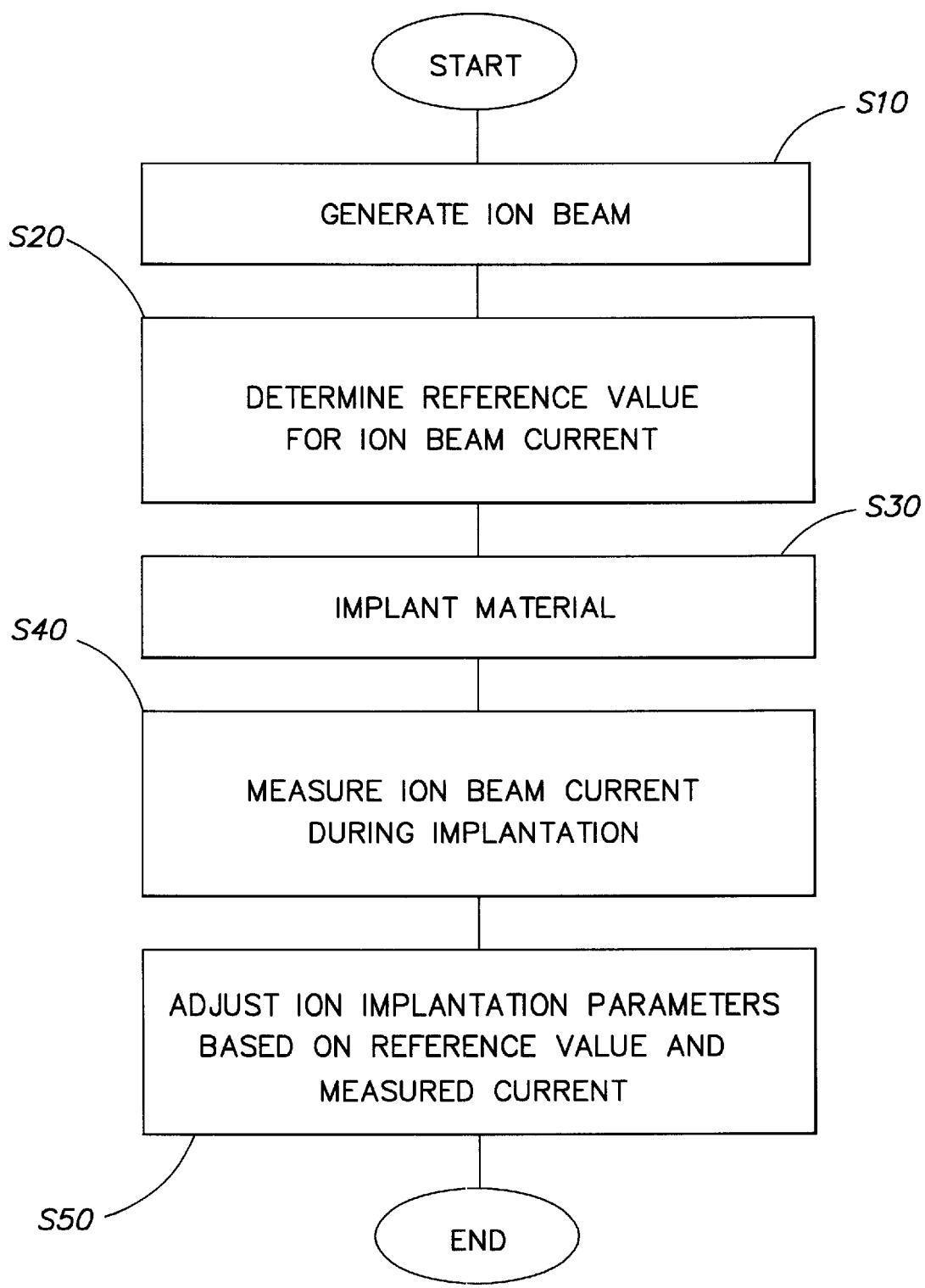
FIG. 4 is a flow chart of steps of a method for adjusting ion implantation parameters in accordance with the invention.

FIG. 4 shows a flowchart of steps of a method for adjusting ion implantation parameters based on an ion beam current reference value and a measured beam current.

In step S10 an ion beam is generated. The ion beam can be generated in any one of several well-known ways in the art and can include any type of desired ion species at any desired energy. The ion beam typically includes substantially only one ion species, but the beam may include different ion species, if desired.

In step S10, a reference value for the ion beam current is determined. The ion beam current is a measure of an amount of charge carried by particles in the beam per unit area or for a total cross-sectional area of the beam over a period of time. The reference value can be a measured beam current when the vacuum level within an ion implantation system is at a desired level. For example, the ion beam current may be measured before implantation of a wafer has begun, when the vacuum level within the ion implantation system and along an ion beam path is relatively high and stable.

In step S30, a material, such as a semiconductor wafer, is implanted using the ion beam generated in step S10. Implantation of the material can be performed by directing the ion beam at a desired angle toward the semiconductor wafer such that energetic particles in the beam are implanted in the material.

In step S40, the ion beam current is measured during implantation. The beam current can be measured using any desired beam current measuring device, such as a Faraday cup, a detector that uses calorimetry or beam-induced magnetic field measurements, or other detector. The ion beam current can be measured at a position adjacent the material being implanted or along the beam path to the material being implanted.

In step S50, ion implantation parameters are adjusted based on the reference value for the ion beam current and the measured beam current during implantation. For example, the difference between the reference value and the measured current can be determined and ion implantation parameters can be adjusted based on the difference value. Various different ion implantation parameters can be adjusted based on the difference value. For example, the wafer scan rate can be adjusted, e.g., decreased, to accommodate for a decrease in dosing level resulting from vacuum fluctuations along the beam path during implantation. Other ion implantation parameters can be adjusted, such as the beam current, the beam scan rate or frequency, beam uniformity, the evacuation rate of a vacuum system used to control the vacuum level along the beamline, etc. The difference value between the reference value for the beam current and the measured beam current during implantation can be scaled to account for non-line of sight collisions that contribute to a decrease in detected beam current and a decrease in wafer dosing, and line of sight collisions that contribute to a decrease in detected beam current, but do not affect wafer dosing. Thus, the difference value can be scaled and implant parameters can be adjusted so that a desired dose is delivered to the semiconductor material.

While the invention has been described in conjunction with specific embodiments thereof, it is evident that many alternatives, modifications and variations will be apparent to those skilled in the art. Accordingly, preferred embodiments of the invention as set forth herein are intended to be illustrative, not limiting. Various changes may be made without departing from the invention.

What is claimed is:

1. An ion implantation system comprising:
   means for generating an ion beam;
   means for determining an ion beam current reference level;
   means for measuring an ion beam current during implantation; and
   means for adjusting an ion implantation parameter to compensate for vacuum fluctuations during implantation based on the reference level and the measured ion beam current, and not based on a detected pressure.

2. An ion implantation system comprising:
   a beam generator that generates an energetic ion beam and directs the beam toward a semiconductor wafer;
   a detector that detects an ion beam current;
   a wafer drive that moves the semiconductor wafer in a direction transverse to the ion beam path; and
   a controller that receives signals from the detector representative of a detected ion beam current, detects a vacuum fluctuation based on the detected ion beam current, and controls the wafer drive to adjust a wafer scan rate to compensate for the vacuum fluctuation during implantation.

3. The apparatus of claim 2, wherein the controller scales the difference value to account for non-line of sight and line of sight charge exchanging collisions experienced by ions in the beam along the ion beam path.

4. The apparatus of claim 3, wherein the difference value is scaled based on a ratio of line of sight collisions to non-line of sight collisions.

5. The apparatus of claim 2, further comprising a vacuum system, and wherein the controller controls the vacuum system to begin evacuation based on the determined difference value.

6. The apparatus of claim 2, wherein the detector is a Faraday cup positioned adjacent a semiconductor wafer.

7. The apparatus of claim 2, wherein the beam generator includes an angle corrector magnet.

8. The apparatus of claim 2, wherein the ion beam current reference value is determined based on an ion beam current measured while a vacuum level along the ion beam path is stable.

9. The apparatus of claim 2, wherein the ion beam current reference value is retrieved by the controller from a memory.

10. The apparatus of claim 2, wherein the controller detects a vacuum fluctuation based on a difference value between an ion beam current reference value, which corresponds to an ion beam current in the absence of vacuum fluctuations along an ion beam path, and an ion beam current measured in the presence of vacuum fluctuations along the ion beam path.

11. The apparatus of claim 2, wherein the controller adjusts an ion implantation parameter in addition to the wafer scan rate to adjust for wafer dosing non-uniformity in two dimensions.

12. The apparatus of claim 2, wherein the controller adjusts a wafer scan rate and a beam scan rate.

13. The apparatus of claim 12, wherein the controller adjusts the wafer scan rate and beam scan rate based on two scale factors.

14. The apparatus of claim 2, wherein the controller adjusts the wafer scan rate using a scale factor that is mathematically derived by modeling the implantation system.

15. The apparatus of claim 14, wherein the controller uses a scale factor that has been determined based on calculated beam path length neutral particle density products that are obtained, at least in part, from a model of an ion beam path and a vacuum system in the implantation system.

* * * * *